United States Patent
Windler et al.

(10) Patent No.: US 7,640,463 B2
(45) Date of Patent: Dec. 29, 2009

(54) ON-CHIP RECEIVER EYE FINDER CIRCUIT FOR HIGH-SPEED SERIAL LINK

(75) Inventors: Peter Windler, Fort Collins, CO (US); Richard Lim, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 417 days.

(21) Appl. No.: 11/479,839

(22) Filed: Jun. 30, 2006

(65) Prior Publication Data

US 2008/0005629 A1    Jan. 3, 2008

(51) Int. Cl.
*G06F 11/00* (2006.01)
(52) U.S. Cl. .................. 714/707; 714/700; 714/704; 714/709; 714/713; 714/715; 714/721; 714/731; 714/744; 714/712; 714/30; 714/43; 375/224; 375/355; 375/371; 375/293; 375/317; 327/73; 386/89; 702/89; 702/125
(58) Field of Classification Search .................. None
See application file for complete search history.

(56) References Cited

U.S. PATENT DOCUMENTS

| | | | | |
|---|---|---|---|---|
| 4,449,102 A * | 5/1984 | Frazer | .................. | 327/165 |
| 4,525,847 A | 6/1985 | Bremer | .................. | 375/59 |
| 4,630,290 A | 12/1986 | Kage | .................. | 375/104 |
| 5,036,529 A | 7/1991 | Shin | .................. | 375/119 |
| 5,193,035 A * | 3/1993 | Kanota et al. | .................. | 360/51 |
| 5,343,405 A * | 8/1994 | Kucera et al. | .................. | 702/73 |
| 5,379,323 A | 1/1995 | Nakaya | .................. | 375/85 |
| 5,602,879 A | 2/1997 | Wada | .................. | 375/355 |
| 5,633,899 A * | 5/1997 | Fiedler et al. | .................. | 375/376 |
| 5,703,914 A | 12/1997 | Nakamura | .................. | 375/355 |
| 6,002,510 A | 12/1999 | Ishizaka | .................. | 359/248 |
| 6,084,931 A * | 7/2000 | Powell et al. | .................. | 375/355 |
| 6,430,715 B1 | 8/2002 | Myers et al. | .................. | 714/704 |
| 6,617,896 B2 | 9/2003 | Uenishi et al. | .................. | 327/170 |
| 6,701,466 B1 * | 3/2004 | Fiedler | .................. | 714/699 |

(Continued)

OTHER PUBLICATIONS

What is a Microprocessor? Definition by PC Magazine at http://www.pcmag.com/encyclopedia_term/0,2542,t=microprocessor&i=46956,00.asp#.*

*Primary Examiner*—John P Trimmings
(74) *Attorney, Agent, or Firm*—Suiter Swantz pc llo

(57) ABSTRACT

In a high-speed serial link, an eye finder diagnostic circuit has improved performance by being on-chip with the existing capture latch(es) of a receive equalizer. The eye finder circuit employs an additional capture latch with its input tied to the same input node as the existing capture latch(es) of a receive equalizer. The additional capture latch has a clock input and reference voltage input. The clock input is adjusted through a phase interpolator (or variable delay line) while the reference voltage input is adjusted by a voltage generator. A digital post processing circuit then compares the output of the additional capture latch with the output of the other existing capture latch(es), in order to determine the receive eye opening. The horizontal eye opening is measured by changing the phase of the additional capture latch through the phase interpolator, while the vertical eye opening is measured by changing the reference voltage of the voltage generator of the additional capture latch. The eye finder circuit, being on-chip and in-line with existing capture latch(es), employs a minimum of power, minimum of area, and minimizes the extra loading to the existing equalizer output.

17 Claims, 2 Drawing Sheets

Rx Eye Finder Block Diagram

U.S. PATENT DOCUMENTS

| | | | |
|---|---|---|---|
| 6,731,683 B1 * | 5/2004 | Fiedler et al. | 375/232 |
| 6,757,327 B1 * | 6/2004 | Fiedler | 375/232 |
| 6,882,684 B2 | 4/2005 | Kaku et al. | 375/229 |
| 6,882,944 B2 | 4/2005 | Fujisaku | 702/66 |
| 7,336,749 B2 * | 2/2008 | Garlepp | 375/355 |
| 7,433,397 B2 * | 10/2008 | Garlepp et al. | 375/229 |
| 2004/0234014 A1 * | 11/2004 | Chen | 375/350 |
| 2005/0069031 A1 * | 3/2005 | Sunter et al. | 375/224 |
| 2007/0217559 A1 * | 9/2007 | Stott et al. | 375/355 |

* cited by examiner

Rx Eye Finder Block Diagram

Rx Eye Finder Waveform

ON-CHIP RECEIVER EYE FINDER CIRCUIT FOR HIGH-SPEED SERIAL LINK

CROSS-REFERENCE TO RELATED APPLICATIONS

[none]

BACKGROUND OF THE INVENTION

1. Field of Invention

The present invention relates generally to the field of diagnostic test circuitry for high-speed serial links.

2. Description of Related Art

In telecommunications, an eye pattern is a display on an oscilloscope in which a pseudorandom digital data signal is repetitively sampled and applied to the vertical input of the oscilloscope, while the data rate is used to trigger the horizontal sweep. The eye pattern is so called because when the signal sampled is in NRZ (Non-Return-To-Zero) code, the pattern resembles eyes between a pair of rails. Since a receive waveform can be degraded during transmission due to intersymbol interference, jitter, crosstalk, noise and the like, system performance can be derived by analyzing the eye pattern. An open eye pattern corresponds to minimal signal distortion, while a closed eye pattern implies distortion.

Diagnostic circuits to derive an eye pattern for display on an oscilloscope or monitor are known in the art. In a high-speed serial link receiver, a receive equalizer functions to reduce received signal distortion. At the output of the receive equalizer is an eye pattern detection circuit. However, in the art such eye pattern detection circuits are not located in the same chip as the receive equalizer but are off-chip.

Having the eye pattern detection circuit off-chip has disadvantages. Driving the receive equalizer output signal off-chip requires additional pins on the chip housing the receive equalizer. Driving the signal off-chip also often results in the signal being measured being degraded.

In prior eye pattern detectors, a system of clock interpolation and two additional capture latches is used. The clock is skewed on one capture latch and compared to the other latch to determine the width of the receive eye opening from the output of the receive equalizer. However, the system of clock interpolation and the two additional capture latches add too much extra loading to the equalizer output, as well as requiring two full phase interpolators, one for each latch, to control the clocks. This requires additional cost and power consumption to the receiver circuit being tested.

What is lacking in the prior art is a method and apparatus for a diagnostic circuit for measuring the eye pattern downstream from the output of a receive equalizer in a high-speed receiver serial link, that is on-chip to the circuit housing the receive equalizer, and employs a minimum of capture latches, such as taught in the present invention.

SUMMARY OF THE INVENTION

Accordingly, an aspect of the present invention is to provide an eye pattern finder diagnostic circuit of the kind used for a high-speed serial link receiver that resides on the same chip housing the receive equalizer, minimizing the number of additional pins needed.

A further aspect of the present invention is to employ an on-chip eye pattern detector using a minimum of capture latches and phase interpolators compared to prior techniques, to minimize chip area and power consumed.

Another aspect of the present invention is to employ an eye finder circuit that does not resort to driving the receive equalizer output circuit signal off-chip, and minimizes the extra loading on the equalizer.

A further aspect of the present invention is to employ an eye finder diagnostic circuit that requires fewer additional circuitry in the analog signal domain, and allows the digital signal portions of any receiver in a high-speed serial link to do more complex post-processing on the raw data output by a receive equalizer, without the need for conversion from digital to analog or analog to digital.

In a preferred embodiment the present invention eye finder circuit measures the horizontal eye opening by changing the phase of an additional capture latch that is on-chip with the capture latch in-line to the equalizer output. The eye finder circuit measures the vertical eye opening by changing the reference voltage of the additional capture latch.

The sum total of all of the above advantages, as well as the numerous other advantages disclosed and inherent from the invention described herein, creates an improvement over prior techniques.

The above described and many other features and attendant advantages of the present invention will become apparent from a consideration of the following detailed description when considered in conjunction with the accompanying drawings.

BRIEF DESCRIPTION OF THE DRAWINGS

Detailed description of preferred embodiments of the invention will be made with reference to the accompanying drawings. Disclosed herein is a detailed description of the best presently known mode of carrying out the invention. This description is not to be taken in a limiting sense, but is made merely for the purpose of illustrating the general principles of the invention. The section titles and overall organization of the present detailed description are for the purpose of convenience only and are not intended to limit the present invention.

Figure 1:
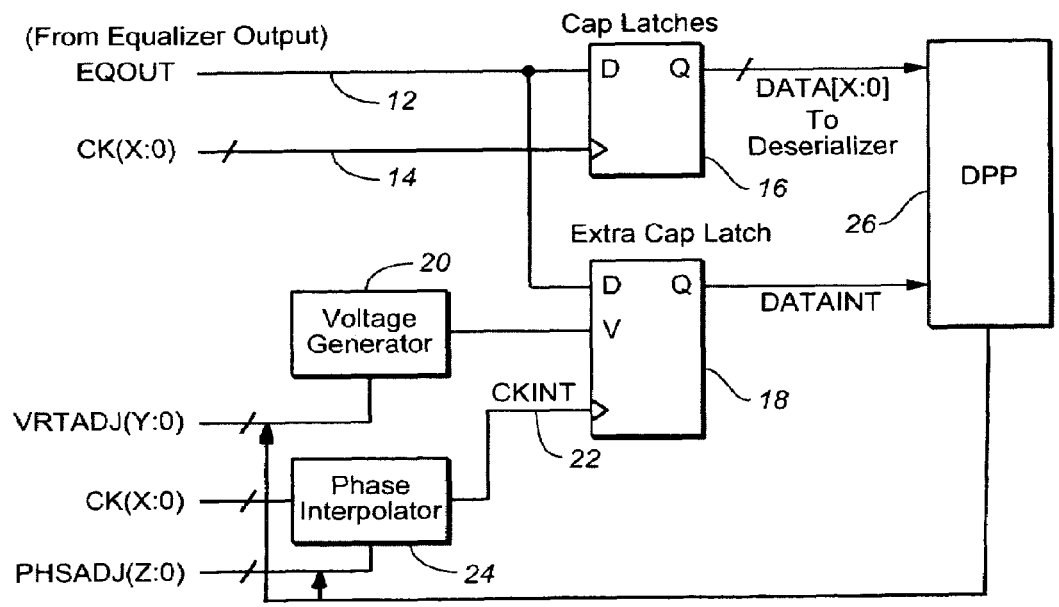
FIG. 1 is a block diagram detailing the receiver eye finder circuit of the present invention.

It should be understood that one skilled in the art may, using the teachings of the present invention, vary embodiments shown in the drawings without departing from the spirit of the invention herein. In the figures, elements with like numbered reference numbers in different figures indicate the presence of previously defined identical elements.

DETAILED DESCRIPTION OF THE INVENTION

The method and apparatus of the present invention comprises the circuit shown in FIG. 1, a block diagram detailing the receiver eye finder diagnostic circuit that lies in-line and downstream of the equalizer circuit in a high-speed serial link receiver having one or more capture latches.

In FIG. 1, there is shown a signal line 12 labeled EQOUT, which is digital output from an equalizer (not shown), and a clock signal line 14 labeled CK(X:0), which is the digital clock signal line leading to a first or existing capture latch (flip-flop) 16, which may be a D-type latch (delay flip-flop) having output Q when the flip-flop is strobed. The output of Q is digital data [X:0], X-bits/word long, that may lead to a deserializer when the present invention is employed in a high-speed serial link. The lines EQOUT, CK(X:0), DATA [X:0] and the capture latch 16 are circuitry components of a receiver found on a single integrated circuit in a high-speed serial link.

FIG. 1 shows the additional circuitry for detecting the eye pattern, the diagnostic circuit, that also resides on the same integrated circuit chip as the receiver circuitry mentioned above in a high-speed serial link receiver; that is, the additional circuitry is on-chip and not off-chip. An extra capture latch 18, which may be a D-type latch having a variable voltage threshold input V, typically an extra differential pair whose inputs are varied from the output of a digital-to-analog converter (DAC), is parallel with the existing capture latch 16. The input D of the extra capture latch 18 receives the output line EQOUT from the equalizer output. The variable voltage threshold input V is connected to a voltage generator 20, typically a 6 to 12 bit DAC. The clock input 22, CKINT, to the extra capture latch 18 is connected to a phase interpolator 24. In the present invention a single extra capture latch 18 is used, tied to (operatively connected to) the existing capture latch 16, which minimizes minimize chip area and power consumed.

Voltage generator 20 receives as input the signal VRTADJ (Y:0), the voltage adjustment signal or vertical eye adjustment level, where Y refers to the bit in a word Y bits long, typically CMOS levels that comes from user-accessible registers, which is an input setting that can adjust the degree of voltage output by voltage generator 20 with a range that spans the vertical range of the eye.

Phase interpolator 24 receives as input the signal CK(X:0) and the signal PHSADJ(Z:0), the phase adjustment signal or horizontal eye adjustment level, where Z refers to a bit in a word Z bits long which may or may not be equal to Y, depending on how much resolution is required for vertical and horizontal resolution. In the present invention the phase interpolator 24 may be equivalently replaced by a variable delay line, and can be considered synonymous with it.

Both the strength and value of signals PHSADJ and VRTADJ may be adjusted by hardware, firmware, or software in a digital post processing (DPP) circuit block 26 to change the horizontal and vertical setting of the eye finder circuit, as explained further herein.

Figure 2:
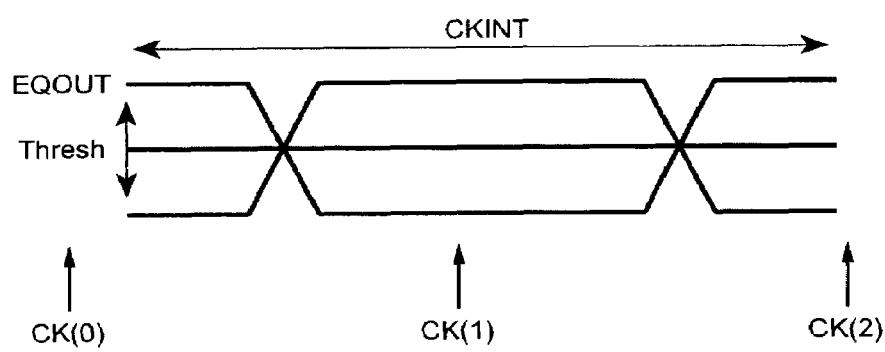
FIG. 2 is a graph of the receiver eye finder waveform created by the present invention.

Turning attention to FIG. 2, there is shown a graph of the receiver eye finder waveform created by the present invention. C(0)/CK(1)/CK(2) represent the clock edges going into the phase interpolator where the output, CKINT, happens to be the interpolated edge between CK(0)/CK(1), or CK(1)/CK(2), where the correct bit is selected through combination logic by comparing it to the main capture latch path, DATA [X:0], as explained further herein. The "threshold" refers to the variable voltage threshold V of the extra capture latch 18, which may be adjusted up or down vertically as shown. CKINT refers to the clock input to the extra capture latch, which is computed, as explained further herein, while the variable EQOUT is from the equalizer output upstream of the present invention.

In the additional extra capture latch 18 portion of the eye finder circuit of FIG. 1, the setting for digital signal PHSADJ helps determine the horizontal eye pattern while the setting for signal VRTADJ helps determine the vertical eye pattern.

Regarding the digital signal PHSADJ, the extra capture Latch 18 is clocked by a phase interpolator 24 that can be moved in time to any point that the existing capture latch 16 clocks are located. The phase interpolator 24 may be equivalently replaced by a variable delay line. The degree of change in phase from the phase interpolator 24 is determined by the signal PHSADJ(Z:0).

Regarding the digital signal VRTADJ, the voltage output by voltage generator 20 depends on the strength (value) of signal VRTADJ(Y:0). The extra capture latch 18 at output DATAINT captures the polarity of the difference in voltage signal between the input at D, which is tied to the same node from equalizer output EQOUT as tied to the existing capture latch 16, and the moveable reference voltage signal generated by the voltage generator 20.

In the present invention, the output of extra capture latch 18, DATAINT, is sent to a digital post-processing circuit block section 26, termed a digital post processor, which may or may not employ a microprocessor (shown as box DPP 26) along with the output of the existing capture latch 16, as well as the output of any other such existing capture latches, that receive output from the equalizer. While only one existing capture latch 16 is shown in FIG. 1, in general it should be understood that several such existing capture latches may be present. Circuitry in the digital post-processing section, DPP 26, which is on-chip with the rest of the present invention, can determine the degree of opening of the receive eye opening signal output in the high-speed serial link. This is done by controlling the clock location of the extra capture latch 18 (via adjusting the signal output by the phase interpolator 24 into clock input CKINT 22), as well as controlling the level of the reference voltage of the extra capture latch, which is generated as output by voltage generator 20 and input into input V of the extra capture latch 18, and then comparing the output of the extra capture latch 18 with the other existing capture latch(es), such as capture latch 16.

To map the eye opening in its entirety for a given setting of the equalizer (the equalizer, not shown, is upstream of the present invention, and has a generally random data output EQOUT), the entire range of VRTADJ and PHSADJ are swept to determine the eye opening for a given setting of equalizer. Further and in addition, the optimum setting of equalizer can be determined by noting when the maximum eye opening occurs for a given value of VRTADJ and PHSADJ.

Figure 3:
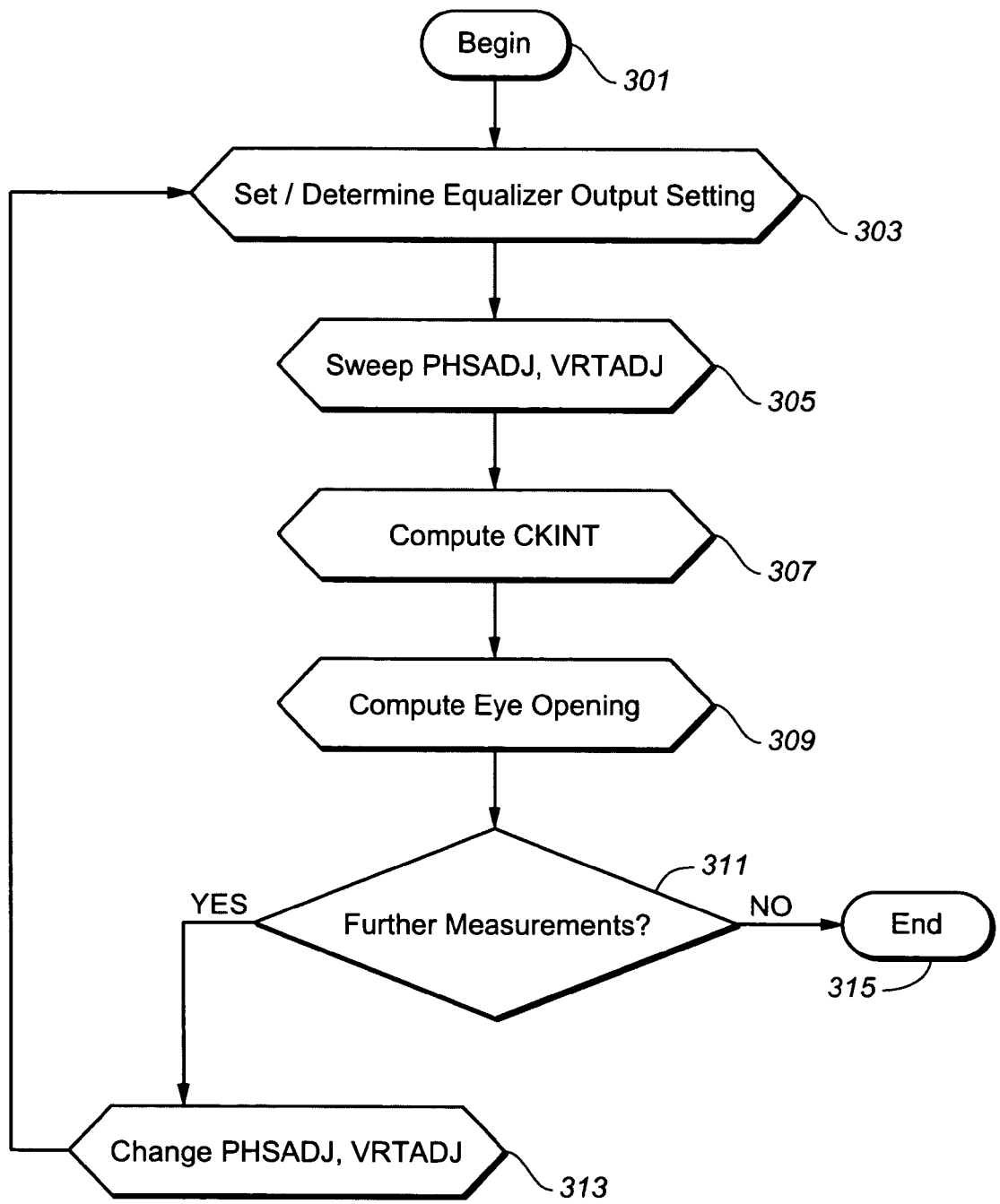
FIG. 3 is a simplified flowchart for the method of the present invention.

Turning attention now to FIG. 3 there is shown a simplified flowchart of the method of the present invention. The method of the present invention, using the output of the circuits described herein, could be implemented in a software program and/or hardware or firmware. The method is represented in FIG. 3 in a simplified manner as a procedural process, but the method could also be event driven (with suitable count-down timers to trigger events).

The method begins in step 301, after any suitable initialization, and proceeds in step 303 to set or determine the equalizer output setting, which produces a random output EQOUT. Next, the steps 305, 307 are performed (which may be performed simultaneously or out of the order shown in the flowchart, which is merely illustrative). In step 305, the signal variables PHSADJ and VRTADJ are swept (over their entire range) which control the horizontal eye opening and vertical eye opening, respectively. In step 307, the clock signal CKINT is computed. Due to the unknown phase interpolation delay caused by the phase interpolator 24, the absolute position of the clock signal CKINT is not known and must be computed. This is done by inferring in the digital post-processing portion DPP 26 of the diagnostic circuit the absolute position of the clock by comparing the data DATAINT output from extra capture 18 to the other DATA[X:0] values output by one or more other existing capture latches, such as existing capture latch 16. A random data pattern comes in at EQOUT 12, and if the correct data is not picked by the digital post-processing portion DPP 26 of the diagnostic circuit, there will not be an eye-opening. Therefore, a bit-by-bit comparison is done between the output of the main existing capture latch 16 and the extra capture latch 18. The incoming data pattern is random, and if the wrong data is being compared with the extra capture latch data, the error rate will be 0.5. This error rate (in errors per total received bits) will indicate that this is not the correct capture latch to compare, and the digital post-processor DPP 26 must recompare the data to determine the correct clock CKINT.

In decision box step 309, the software, firmware and/or hardware in the digital post-processing portion of the diagnostic circuit will compare the output of the extra capture latch 18, DATAINT, to the output of one or more capture latches, such as output DATA[X:0] of capture latch 16, to determine what is the eye opening detected (based on both horizontal and vertical eye openings). Further and optionally, the settings of parameters VRTADJ(Y:0), which determines the vertical eye opening, and the setting for PHSADJ(Z:0), which determines the horizontal eye opening, as well as the degree of eye opening may be noted and stored in memory for any given equalizer setting, in order to determine the best eye pattern.

The digital post-processing portion DPP 26 of the diagnostic circuit can determine the receive eye opening by controlling the clock location (e.g. as set for CKINT in step box 307, via the interpolated clock as set by the phase interpolator 24) and controlling the reference voltage generated at input V of the extra capture latch 18 by the voltage generator 20 in FIG. 1, (e.g., such as set in steps 305-309), and comparing the output DATAINT of the extra capture latch 18 with the output DATA[X:0] of the existing capture latch(es), such as capture latch 16 in FIG. 1. The horizontal eye opening is measured by changing the phase of the additional capture latch through the phase interpolator, while the vertical eye opening is measured by changing the reference voltage of the voltage generator of the additional capture latch.

In decision box step 311, the method of the present invention determines if there are additional measurements to be made, e.g., to determine the eye opening for another equalizer setting. In this case, as indicated by the "YES" branch in step 311, the values for PHSADJ and VRTADJ are changed, as shown in box 313, and the process outlined above is repeated: setting and sweeping parameters PHSADJ and VRTADJ for a given equalizer output setting, with clock and reference voltage for the additional capture latch 18 adjusted accordingly, computing the clock CKINT and computing the resulting eye opening. Otherwise, if no further measurements are necessary, the method of the present invention terminates, as indicated by step 315.

Further, although the present invention has been described in terms of the preferred embodiments above, numerous modifications and/or additions to the above-described preferred embodiments would be readily apparent to one skilled in the art.

It is intended that the scope of the present invention extends to all such modifications and/or additions and that the scope of the present invention is limited solely by the claims set forth below.

We claim:

1. An eye finder diagnostic circuit for a serial link receiver comprising:
    an existing capture latch for the serial link receiver having an input tied to a receive equalizer output, the existing capture latch residing on an integrated circuit; and,
    a single extra capture latch having a first input tied to the same input as the existing capture latch;
    wherein the single extra capture latch resides on the same integrated circuit as the existing capture latch;
    a single voltage generator;
    a single phase interpolator; and,
    said single extra capture latch having two further inputs and an output, one of said two inputs being a clock input and the other one of said two inputs being a variable voltage threshold input, said clock input connected to the output of the single phase interpolator and said variable voltage threshold input connected to the output of the single voltage generator; and
    a digital post processing (DPP) circuit including a microprocessor connected to the output of the existing capture latch and the single extra capture latch, for processing the output of the existing capture latch and the single extra capture latch, where the digital post processing (DPP) circuit is configured to determine a receive eye opening by controlling the clock location, controlling a reference voltage generated by the single voltage generator, and comparing the output of the single extra capture latch with the output of the existing capture latch;
    wherein the eye finder diagnostic circuit for the serial link receiver resides on a chip housing the receive equalizer.

2. The invention of claim 1, wherein:
    said single voltage generator receives an input signal comprising a voltage adjustment signal, the voltage output by said single voltage generator depending on said voltage adjustment input signal;
    said single phase interpolator receives input signals comprising a phase adjustment signal and a clock signal;
    said DPP circuit adjusts the value of said input signals of said single voltage generator and said single phase interpolator.

3. The invention of claim 2, wherein:
    said input signal for said single voltage generator and said input signal for said single phase interpolator are digital signals, said DPP circuit adjusts the value of said digital signals; and,
    said single extra capture latch captures, and outputs in its output, the polarity of the difference in voltage signal between said single extra capture latch first input tied to the same input as the existing capture latch and said variable voltage threshold input receiving said voltage output by said single voltage generator.

4. The invention of claim 3, wherein:
    said single phase interpolator input clock signal is tied to and substantially equal to the clock signal input to said existing capture latch.

5. The invention of claim 3 wherein:
    said DPP circuit computes said clock input for said single extra capture latch by interpolation based on the outputs of said existing capture latch and said single extra capture latch.

6. The invention of claim 5, wherein:
    said DPP circuit resides on the same integrated circuit as said existing capture latch and said single extra capture latch.

7. The invention of claim 5, wherein:
    said DPP circuit determines the degree of horizontal opening of the eye by controlling the clock location of the single extra capture latch by adjusting the value of signal output by said single phase interpolator into said clock input of said single extra capture latch;
    said DPP circuit determining the degree of vertical opening of the eye by controlling the output of the single voltage generator that is input into said variable voltage threshold input of said single extra capture latch; and, said DPP circuit determining the eye opening by comparing the output of said single extra capture latch with said existing capture latch.

8. The invention of claim 1, wherein:
said single phase interpolator receiving a clock signal in a clock signal input, said clock signal the same clock signal received by said existing capture latch, and said single phase interpolator receiving a digital phase adjustment signal;
said single voltage generator receives an input signal comprising a voltage adjustment signal, the voltage output by said single voltage generator depending on said voltage adjustment input signal;
said DPP circuit adjusts the value of said input signals for said single voltage generator and said single phase interpolator; and,
said DPP circuit computes said clock input for said single extra capture latch by interpolation based on the outputs of said existing capture latch and said single extra capture latch.

9. The invention of claim 8, wherein:
said DPP circuit determines the horizontal eye opening for an eye pattern by controlling the clock of said single extra capture latch via adjusting the voltage output by said single phase interpolator; and
said DPP circuit determines the vertical eye opening for the eye pattern by controlling the level of the voltage output by said single voltage generator into said variable voltage threshold input of said single extra capture latch, and by comparing the output of said single extra capture latch with the output of said existing capture latch.

10. The invention according to claim 9, wherein:
said DPP circuit resides on the same integrated circuit as the existing capture latch and the single extra capture latch.

11. A method for minimizing circuitry on an on-chip diagnostic circuit and determining the eye in an eye finder circuit comprising the steps of:
tying the input of an existing capture latch to the output of a receive equalizer;
tying the input of a single extra capture latch to the same output of the receive equalizer as the input into the existing capture latch;
placing both said existing capture latch and said single extra capture latch on the same integrated circuit, where the same integrated circuit resides on a chip housing a receive equalizer and a single voltage generator and a single phase interpolator; and
sending an output of the existing capture latch and an output of the single extra capture latch to a digital post processing (DPP) circuit having a microprocessor in order to determine the eye.

12. The method according to claim 11, further comprising the steps of:
connecting the output of a single voltage generator to an input of the single extra capture latch;
connecting the output of a single phase interpolator to the clock input of the single extra capture latch, the single phase interpolator having digital inputs comprising a clock signal, the clock signal being the same as the clock signal that is input into the capture latch, and a phase adjustment signal;
adjusting a clock signal CKINT for the clock input of the single extra capture latch by adjusting the digital inputs of the single phase interpolator.

13. The method according to claim 12, further comprising the steps of:

adjusting the voltage output of the single voltage generator to control the vertical eye pattern;
adjusting the output of the phase generator to control the horizontal eye pattern,
said adjusting of the voltage output of the single voltage generator and output of the phase generator done by controlling the input signals to the single voltage generator and the phase generator, said input signals being digital.

14. The method according to claim 13, further comprising the steps of:
sweeping a range of values for the digital input signals to said single voltage generator and said phase generator through said DPP circuit;
connecting a digital post processing (DPP) circuit to the output of the existing capture latch and the single extra capture latch;
controlling the digital input signals to said single voltage generator and said phase generator through said DPP circuit;
said DPP circuit residing on the same integrated circuit as the existing capture latch and the single extra capture latch.

15. The method according to claim 12, further comprising the steps of:
connecting the digital post processing (DPP) circuit to receive the output of the existing capture latch and the single extra capture latch;
controlling the digital input signals to said single voltage generator and said phase generator through said DPP circuit;
said DPP circuit residing on the same integrated circuit as the existing capture latch and the single extra capture latch.

16. The method according to claim 15, further comprising the steps of:
capturing, using the single extra capture latch, the polarity of the difference in voltage signal between the single extra capture latch input tied to the same input as the existing capture latch and the voltage output by said single voltage generator into the input of the single extra capture latch;
outputting what is captured by the single extra capture latch into the DPP circuit,
comparing the output of the existing capture latch and the single extra capture latch, using the DPP circuit, to compute the clock signal CKINT.

17. A receive eye opening detector for use in a serial link receiver receiving output from an equalizer, comprising:
an existing capture latch for a serial link receiver having an input tied to the receive equalizer output, the existing capture latch residing on an integrated circuit, having a digital clock input CK(X:0), and a digital output DATA [X:0]; and,
a single extra capture latch having a first input tied to the same input as the existing capture latch, a second input comprising of a variable voltage threshold input from a single variable voltage generator where the single variable voltage generator is for the single extra capture latch, and a third input comprising a clock signal input receiving a clock signal CKINT, and an output outputting a signal DATAINT;
means for adjusting the vertical eye in an eye pattern connected to the variable voltage threshold input, said means for adjusting the vertical eye outputting a voltage signal to the variable voltage threshold input of the single extra capture latch in response to a digital input signal VRTADJ(Y:0);

means for adjusting the horizontal eye in an eye pattern connected to the clock signal input of the single extra capture latch; said means for adjusting the horizontal eye receiving as a first input the digital clock signal CK(X:0), and as a second input a signal PHSADJ, said means for adjusting the horizontal eye changes the digital clock signal CKINT, and outputs the clock signal CKINT into the single extra capture latch;

a digital post processing (DPP) circuit connected to the output of the existing capture latch and the single extra capture latch, receiving signals DATA[X:0], DATAINT, for processing the output of the existing capture latch and the single extra capture latch, said DPP circuit controlling the value of digital signals VRTADJ(Y:0) and PHSADJ in response to the output signals DATA[X:0], DATAINT from the existing and the single extra capture latches, said DPP circuit including a microprocessor, where the digital post processing (DPP) circuit is configured to determine a receive eye opening by controlling the clock location of the single extra capture latch, controlling a level of the reference voltage of the single extra capture latch generated by a single voltage generator, and comparing the output of the single extra capture latch DATAINT with an output of the existing capture latch DATA[X:0];

wherein the existing capture latch, the single extra capture latch and the DPP circuit all reside on the same integrated circuit, and the same integrated circuit resides on a chip housing a receive equalizer.

* * * * *